United States Patent [19]
Terashima et al.

[11] Patent Number: 5,455,439
[45] Date of Patent: Oct. 3, 1995

[54] SEMICONDUCTOR DEVICE WHICH MODERATES ELECTRIC FIELD CONCENTRATION CAUSED BY A CONDUCTIVE FILM FORMED ON A SURFACE THEREOF

[75] Inventors: Tomohide Terashima, Fukuoka; Kazumasa Satsuma; Masao Yoshizawa, both of Itami, all of Japan

[73] Assignee: Mitsubishi Denki Kabushiki Kaisha, Tokyo, Japan

[21] Appl. No.: 329,052

[22] Filed: Oct. 26, 1994

Related U.S. Application Data

[63] Continuation of Ser. No. 941,606, Sep. 8, 1992, abandoned.

[30] Foreign Application Priority Data

Jan. 16, 1992 [JP] Japan .................... 4-005785

[51] Int. Cl.[6] .......................... H01L 23/535; H01L 29/40
[52] U.S. Cl. .......................... 257/401; 257/409; 257/488; 257/490
[58] Field of Search .................... 257/488, 401, 257/409, 355, 356, 394, 395, 396, 490, 328, 335, 339, 340

[56] References Cited

U.S. PATENT DOCUMENTS

| | | | |
|---|---|---|---|
| 4,766,474 | 8/1988 | Nakagawa et al. | 257/409 |
| 5,040,045 | 8/1991 | McArthur et al. | 357/531 |
| 5,204,545 | 4/1993 | Terashima | 257/488 |

FOREIGN PATENT DOCUMENTS

| | | |
|---|---|---|
| 0461877 | 12/1991 | European Pat. Off. . |
| 4036958 | 11/1990 | Germany . |
| 0173764 | 7/1987 | Japan . |
| 0027044 | 2/1988 | Japan . |
| 0248078 | 10/1990 | Japan .................... 257/409 |
| 2077495 | 5/1981 | United Kingdom . |

OTHER PUBLICATIONS

Patent Abstracts of Japan, vol. 012, No. 013 (E-573) 14 Jan. 1988 JP-A-62 173 764 (Matsushita Electric Works Ltd) Jul. 30, 1987.

Primary Examiner—William Mintel
Assistant Examiner—Peter Toby Brown
Attorney, Agent, or Firm—Lowe, Price, LeBlanc & Becker

[57] ABSTRACT

The present invention relates to a semiconductor device which is fabricated in simple process steps and which prevents deterioration in a breakdown voltage. Two diffusion regions are formed in space in a surface of an n⁻ type layer. The diffusion regions are separated from each other by an insulation layer, but each in contact with a conductive film. Another conductive film is disposed on the insulation layer. The three conductive films are insulated from each other by the insulation layer and still another overlying insulation layer. Still other conductive films are formed on the upper insulation layer, and are coupled to the three conductive films. A wiring conductive film is also formed on the upper insulation layer. The wiring conductive film has a relatively small capacitance with the three conductive films. Due to the device structure, influence of the wiring conductive film over the surface of the semiconductor device is blocked by the conductive films. Hence, an electric field concentration will not result.

14 Claims, 12 Drawing Sheets

5,455,439

SEMICONDUCTOR DEVICE WHICH MODERATES ELECTRIC FIELD CONCENTRATION CAUSED BY A CONDUCTIVE FILM FORMED ON A SURFACE THEREOF

This application is a continuation of application Ser. No. 07/941,606 filed Sep. 8, 1992, now abandoned.

BACKGROUND OF THE INVENTION

1. Field of the Invention

The present invention relates to a technique to moderate an electric field concentration caused by a conductive film which is formed on a surface of a semiconductor device.

2. Description of the Background Art

Normally, doped regions to be connected are exposed at a surface of a semiconductor device. A conductive film is provided, with an insulation layer intervened, on the surface of the semiconductor device to connect the doped regions.

FIG. 1 is a cross sectional view of a conventional semiconductor device. A p type diffusion region 2 and an n type diffusion region 3 are formed in space in a surface of an n⁻ type layer 1. In the surface of an n⁻ type layer 1, the p type diffusion region 2 and the n type diffusion region 3 are separated by an insulation layer 6b. A conductive film 5a is in contact with the diffusion region 2 but otherwise insulated by an insulation layer 6a and the insulation layer 6b. A conductive film 5e is in contact with the diffusion region 3 but otherwise insulated by the insulation layers 6a and 6b. The conductive films 5a and 5e and still other conductive films 5b, 5c and 5d are vertically insulated from each other by the interleaved insulation layers 6a and 6b but horizontally overlap each other. Hence, adjacent conductive films are coupled to each other.

A conductive film 4 is connected with the diffusion region 3 and extends from the diffusion region 3 over the diffusion region 2. The interposed insulation layer 6a insulates the conductive film 4 from the other regions. The conductive film 4 is coupled to the conductive films 5a to 5d.

With a low voltage (−V) applied to the diffusion region 2 and a high voltage (+V) applied to the diffusion region 3, a depletion layer extends from a junction J1 between the n⁻ type layer 1 and the diffusion region 2. In the surface of the n⁻ type layer 1 (i.e., immediately below the insulation layer 6b), the depletion layer extends from the diffusion region 2 toward the diffusion region 3.

The device structure as above places the growth of the depletion layer at the surface of the n⁻ type layer 1 under the influence of a potential at the conductive film 4. Being at the same level as a potential at the diffusion region 3, a potential at the conductive film 4 restrains the growth of the depletion layer, with a result that an electric field concentration is created near the diffusion region 2. During the presence of the electric field concentration, it is difficult to obtain enough breakdown voltage. On the other hand, when the conductive film 4 is connected with the diffusion region 2 and therefore has the same potential as the diffusion region 2, the conductive film 4 helps the depletion growth, whereby an electric field concentration occurs near the diffusion region 3.

The influence of a potential at the conductive film 4 is eliminated by disposing the conductive films so that the conductive films 5a to 5e each have a negligible capacitance with the conductive film 4 as compared to a neighboring conductive film. When this approach is adopted, optimum potentials are obtainable at the conductive films 5a to 5e under almost no influence of a potential developed at the conductive film 4. Thus, a potential at the conductive film 4 exerts only negligible influence over the depletion layer growth in the surface of the n⁻ type layer 1. Hence, deterioration in the breakdown voltage due to an electrical field from the conductive film 4 is prevented.

Despite the advantage as above, the conventional semiconductor device is not satisfactory in terms of process simplicity since the conductive films 5a to 5e need to overlap each other to ensure sufficient capacitances therebetween. To obtain such a stacked arrangement, the conductive films 5a to 5e must be formed in two separate process steps.

SUMMARY OF THE INVENTION

A semiconductor device according to an aspect of the present invention comprises: a first semiconductor layer of a first conductivity type, the first semiconductor layer having a first major surface and a second major surface; a second semiconductor layer of a second conductivity type selectively formed in the first major surface of the first semiconductor layer; a third semiconductor layer of a first conductivity type selectively formed in the first major surface of the first semiconductor layer, the third semiconductor layer being spaced from the second semiconductor layer; a first insulation layer disposed between the second and the third semiconductor layers in the first major surface of the first semiconductor layer, the first insulation layer overlying at least a portion of the second semiconductor layer or a portion of the third semiconductor layer; at least one first conductive film formed on the first insulation layer; a second conductive film formed at least on the first insulation layer, the second conductive film being electrically coupled to the second semiconductor layer; a third conductive film formed at least on the first insulation layer, the third conductive film being electrically coupled to the third semiconductor layer; a second insulation layer covering the first, the second and the third conductive films, the first insulation layer, and the second and the third semiconductor layers; at least two fourth conductive films formed on the second insulation layer, the fourth conductive films each being electrically coupled to two of the first, second and the third conductive films neighboring thereon; and a wiring conductive film formed on the second insulation film except at regions provided with the fourth conductive film, the wiring conductive film extending from the second semiconductor layer to the third semiconductor layer. In the semiconductor device, the first, second and the third conductive films each have a larger capacitance with the fourth conductive film than with the wiring conductive film.

Preferably, the second conductive film is formed also on the second semiconductor layer and connected with the second semiconductor layer.

The third conductive film may be formed also on the third semiconductor layer and connected with the third semiconductor layer.

The third conductive film may be coupled to the third semiconductor layer via the first insulation layer.

Preferably, the first and the second conductivity types are an n type and a p type, respectively.

The third semiconductor layer may be biased higher than the second semiconductor layer.

The fourth conductive film preferably faces the first, the second and the third conductive films in larger areas than the wiring conductive film faces the first, the second and the third conductive films.

Preferably, the fourth conductive film is disposed around the second semiconductor layer except at a predetermined region; the third semiconductor layer is disposed around the fourth conductive film; and the wiring conductive film is formed in the predetermined region and biased to the same potential as the second semiconductor layer.

In other aspect, the fourth conductive film is disposed around the third semiconductor layer except at a predetermined region; the second semiconductor layer is disposed around the fourth conductive film; and the wiring conductive film is formed in the predetermined region and biased to the same potential as the third semiconductor layer.

The semiconductor device preferably includes a MOS structure.

In still other aspect, the semiconductor device further comprises a fourth semiconductor layer formed on the second major surface of the first semiconductor layer, the fourth semiconductor layer being biased to the same potential as the second semiconductor layer.

The semiconductor device may further comprises: a third insulation layer formed on the second major surface of the first semiconductor layer; and a fifth conductive film formed on the third insulation layer. In the semiconductor device, the fifth conductive film may be biased to the same potential as the the second semiconductor layer.

Thus, the fourth conductive film is coupled to the first, the second and the third conductive films in the region not covered with the wiring conductive film. Since the first, the second and the third conductive films each have a larger capacitance with the fourth conductive film than with the wiring conductive film, an optimum potential is obtainable at the first conductive film even in the region covered with the wiring conductive film under almost no influence of a potential at the wiring conductive film. In addition, since the fourth conductive film and the wiring conductive film are obtainable in the same process step, it is possible to easily fabricate a semiconductor device which prevents deterioration in a breakdown voltage due to an electrical field from the wiring conductive film.

Accordingly, an object of the present invention is to obtain a semiconductor device which is fabricated in simple process steps and which prevents deterioration in a breakdown voltage due to an electrical field from a wiring conductive film.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
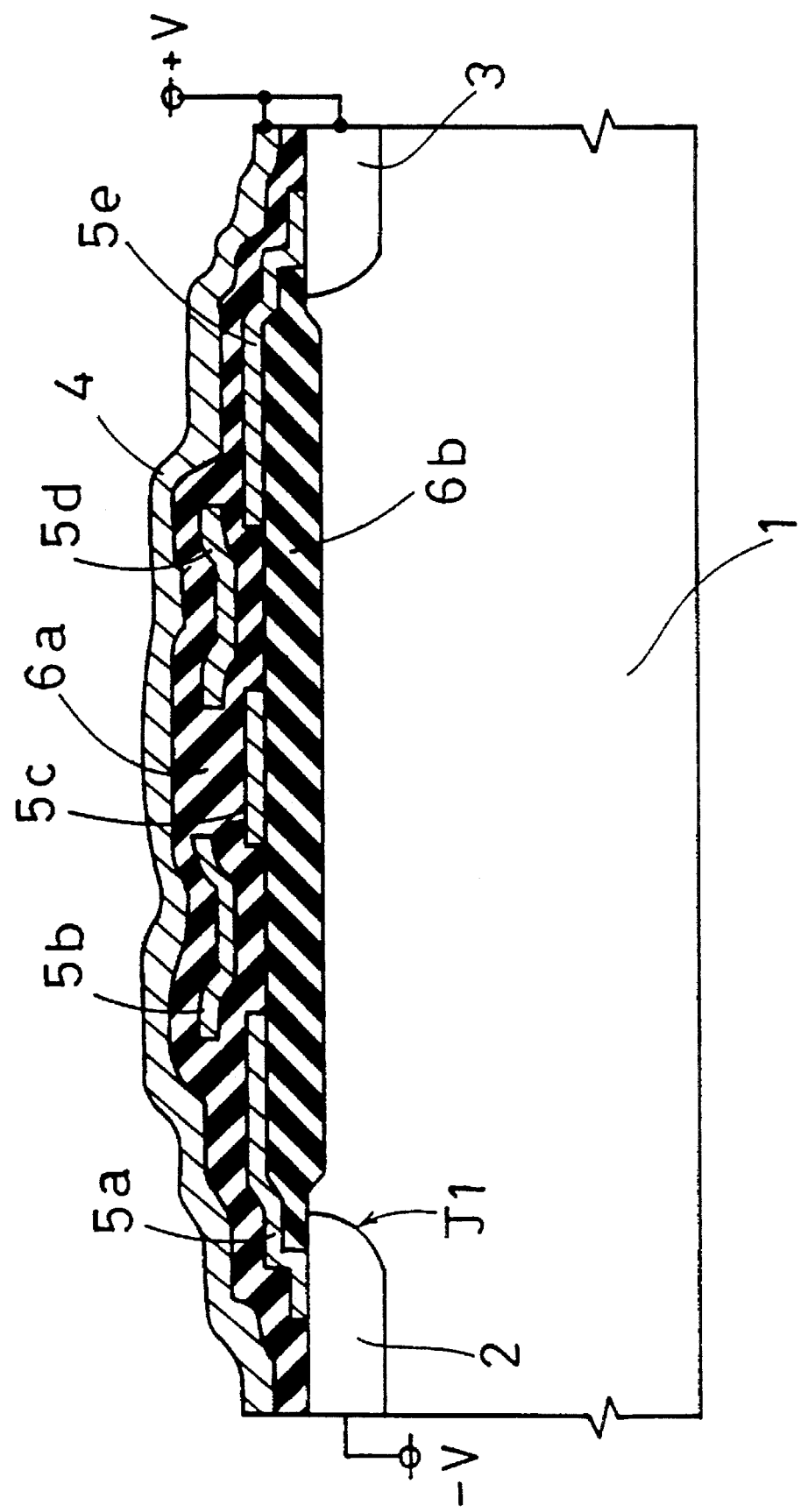
FIG. 1 is a cross sectional view showing a conventional technique.
Figure 2:
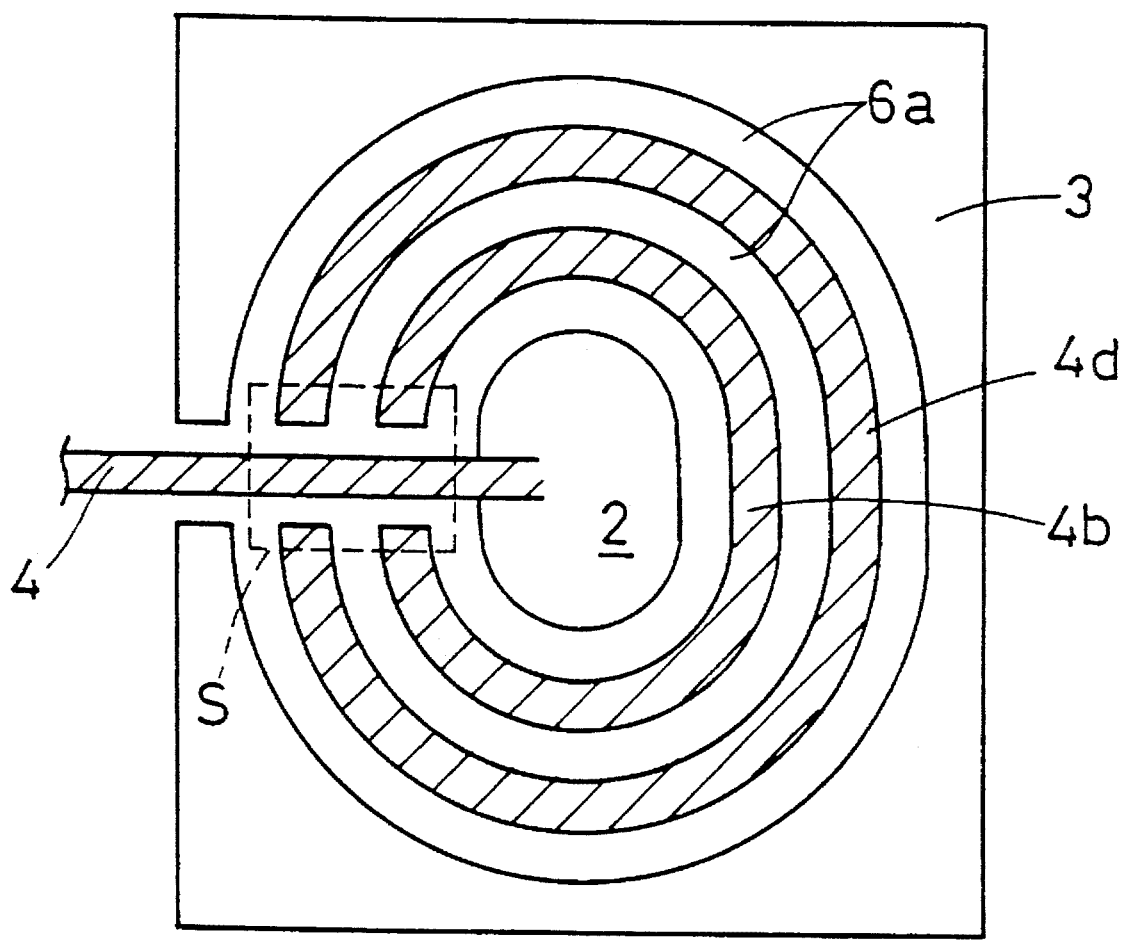
FIG. 2 is a plan view showing a first preferred embodiment of the present invention.

FIG. 2 is a plan view of a semiconductor device according to a first preferred embodiment of the present invention. A p type diffusion region 2 intercepts a surface of an insulation layer 6a in the form of an island, and is connected with a wiring conductive film 4. A conductive film 4b and a conductive film 4d are formed on the insulation layer 6a around the island diffusion region 2 so that they do not cross the wiring conductive film 4. An n type diffusion region 3 is disposed around the conductive films 4b and 4d and intercepts the surface of the insulation layer 6a.

Figure 3:
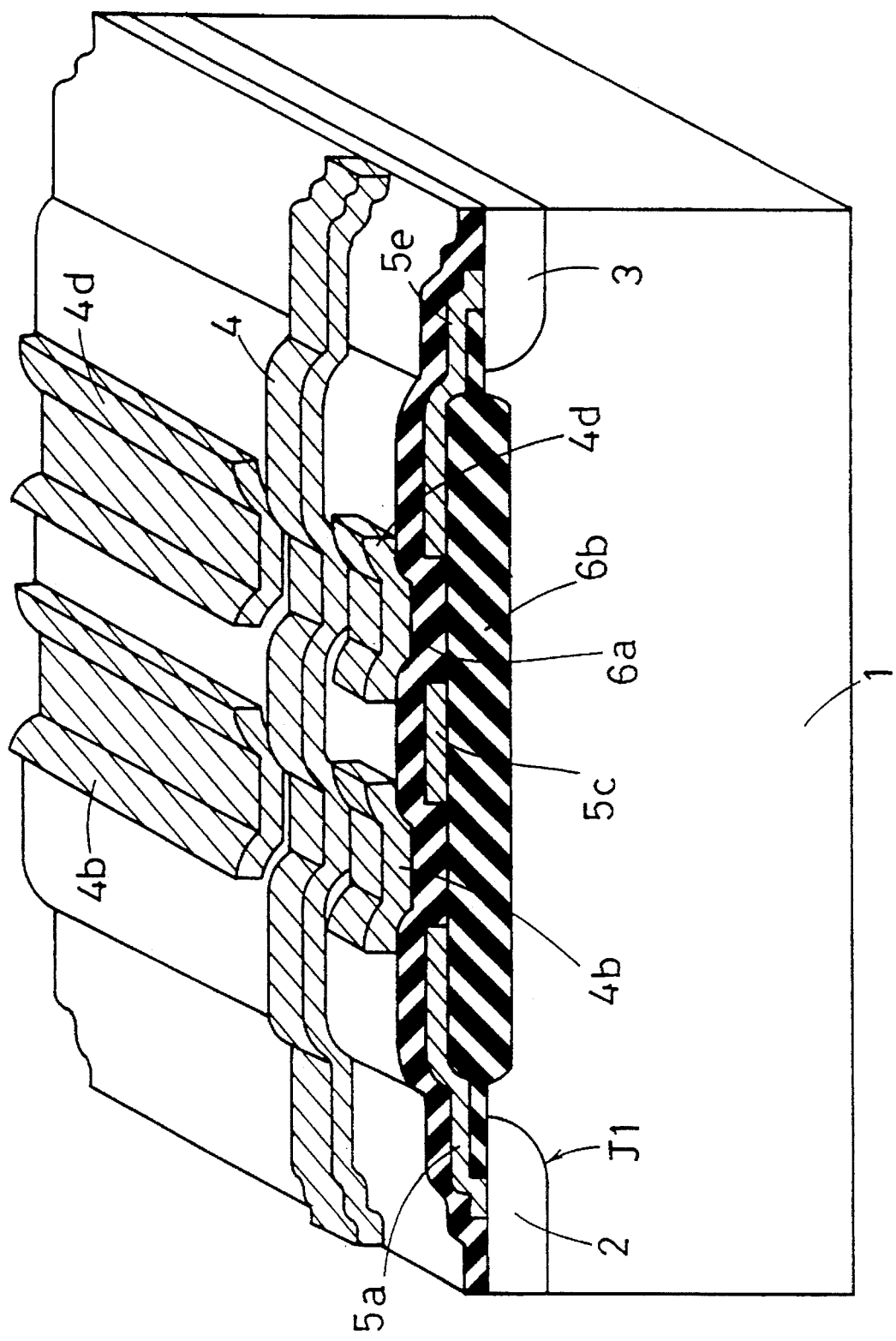
FIG. 3 is a cross sectional perspective view showing the first preferred embodiment of the present invention.

FIG. 3 is a cross sectional perspective view of the semiconductor device focused at a region S (FIG. 2). In a surface of an n⁻ type layer 1, where a resistance is between about 20 to 60 Ωcm, the diffusion regions 2 and 3 are formed in a spaced relation. That is, the diffusion regions 2 and 3 are separated from each other by an insulation layer 6b. A conductive film 5a is in contact with the diffusion region 2 but otherwise insulated by the insulation layers 6a and 6b. A conductive film 5e is in contact with the diffusion region 3 but similarly otherwise insulated by the insulation layers 6a and 6b. A conductive film 5c is formed on the insulation layer 6b and insulated from other regions by the insulation layers 6a and 6b. The conductive films 5a, 5c and 5e run approximately parallel to the conductive films 4b and 4d although not illustrated for clarity.

Disposed separately on the insulation layer 6a, the wiring conductive film 4 and the conductive films 4b and 4d are obtainable at a time.

In the region uncovered with the conductive film 4, the conductive films 5a, 5c and 5e and the conductive films 4b and 4d overlap each other so as to be coupled to each other. More precisely, the conductive film 4b overlaps the conductive films 5a and 5c while the conductive film 4d overlaps the conductive films 5c and 5e. When 15 μm in width, for instance, the conductive films 4b and 4d need to overlap the conductive films 5a, 5c and 5e by 5 μm. In this case, the conductive films 5a and 5e need to overlie the diffusion regions 2 and 3, respectively, by 10 to 20 μm.

The thickness of the insulation layer 6a determines how far the wiring conductive film 4 is separated from the conductive films 5a, 5c and 5e. Hence, the wiring conductive film 4 and the conductive films 4b and 4d are equidistant from the conductive films 5a, 5c and 5e. While the wiring conductive film 4 is around 6 μm in width and crosses the conductive films 5a, 5c and 5e, the conductive films 4b and 4d run in a predetermined overlapping relation width (e.g., overlapping by 5 μm as mentioned earlier) and parallel to the conductive films 5a, 5c and 5e. In the illustrative structure of FIG. 2 where the conductive films 4b and 4d are formed around the diffusion region 2, therefore, the conductive films 5a, 5c and 5e have much larger capacitances with the conductive films 4b and 4d than with the conductive film 4.

In the semiconductor device of FIG. 2, the near-the-surface field concentration in the n⁻ type layer 1 is suppressed in the following manner. The diffusion region 2 is biased with a low voltage (−V) while the diffusion region 3 is biased with a high voltage (+V). In response to the applied voltages, a depletion layer grows from the junction J1 between the n⁻ type layer 1 and the diffusion region 2. Viewed at the surface of the n⁻ type layer 1 (i.e., immediately below the insulation layer 6b), the depletion layer extends from the diffusion region 2 toward the diffusion region 3. Staying at the same potential as the diffusion region 2, the conductive film 4 accelerates the depletion layer growth. Hence, immediately below the wiring conductive film 4, equipotential lines will extend as shown by dashed-and-dotted lines in FIG. 4 if the conductive films 4b and 4d are not provided, giving rise to the electric field concentration H near an edge of the conductive film 5e.

Figure 4:
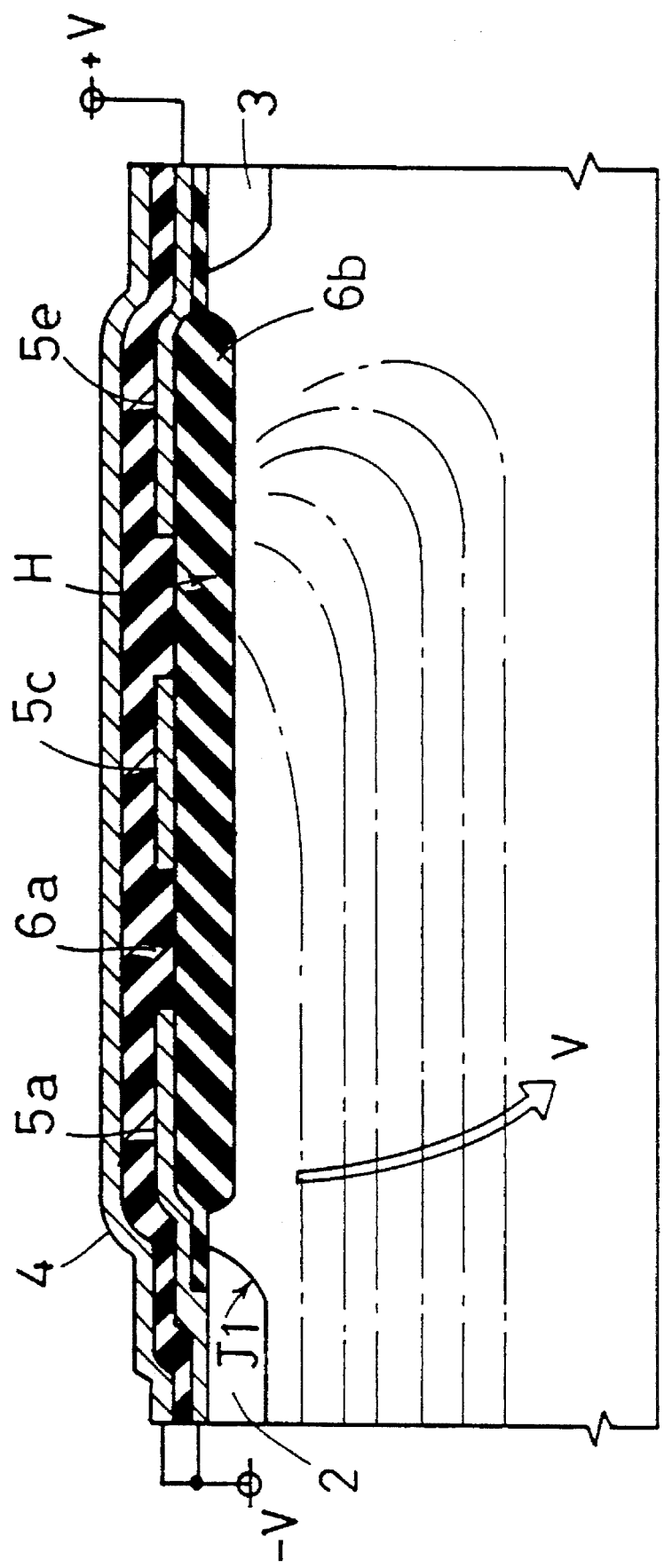
FIGS. 4 and 5 are cross sectional views for explaining device operation of the first preferred embodiment of the present invention.
Figure 5:
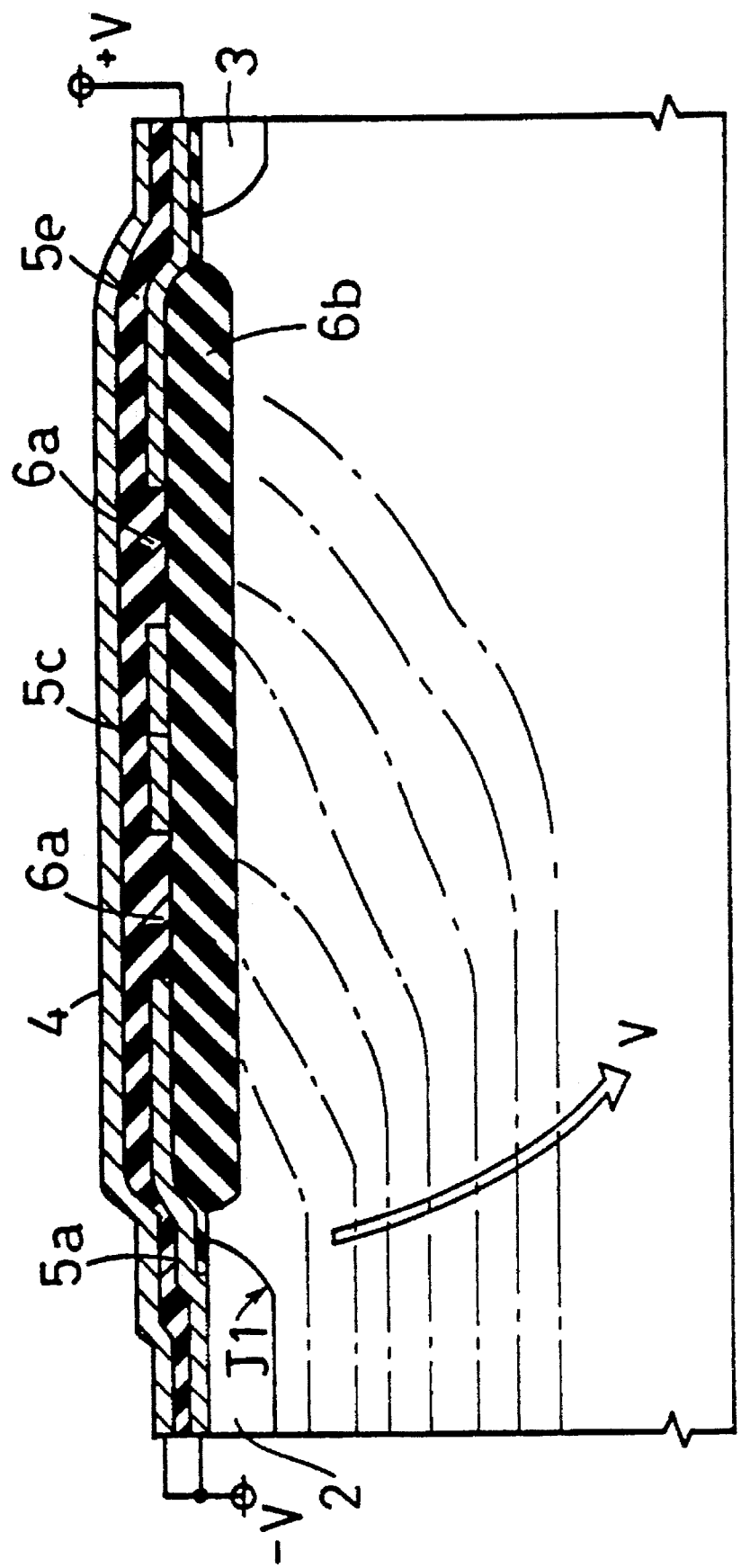

However, when the conductive films 4b and 4d are provided (being behind the wiring conductive film 4 and hence not seen in FIG. 4), the conductive films 5a, 5c and 5e have larger capacitances with the conductive films 4b and 4d and than with the conductive film 4. Hence, growth of the depletion layer immediately below the wiring conductive film 4 is as shown in FIG. 5, allowing that an electric field from the wiring conductive film 4 exerts decreased direct influence over an electric field developed within the n⁻ type layer 1, which in turn obviates an electric field concentration. Although in the region under and around the wiring conductive film 4, the conductive films 4b and 4d do not overlap the conductive films 5a, 5c and 5e, and therefore, each have a break in the region S of FIG. 2, no problem will be caused. Since the breaks are largely reduced in size by forming the wiring conductive film 4 into a small width and since it is possible that the conductive films 5a and 5e overlie the diffusion regions 2 and 3 by optimum distances, deterioration in the breakdown voltage due to the electric field from the wiring conductive film 4 will not result even immediately under the wiring conductive film 4.

Figure 6:
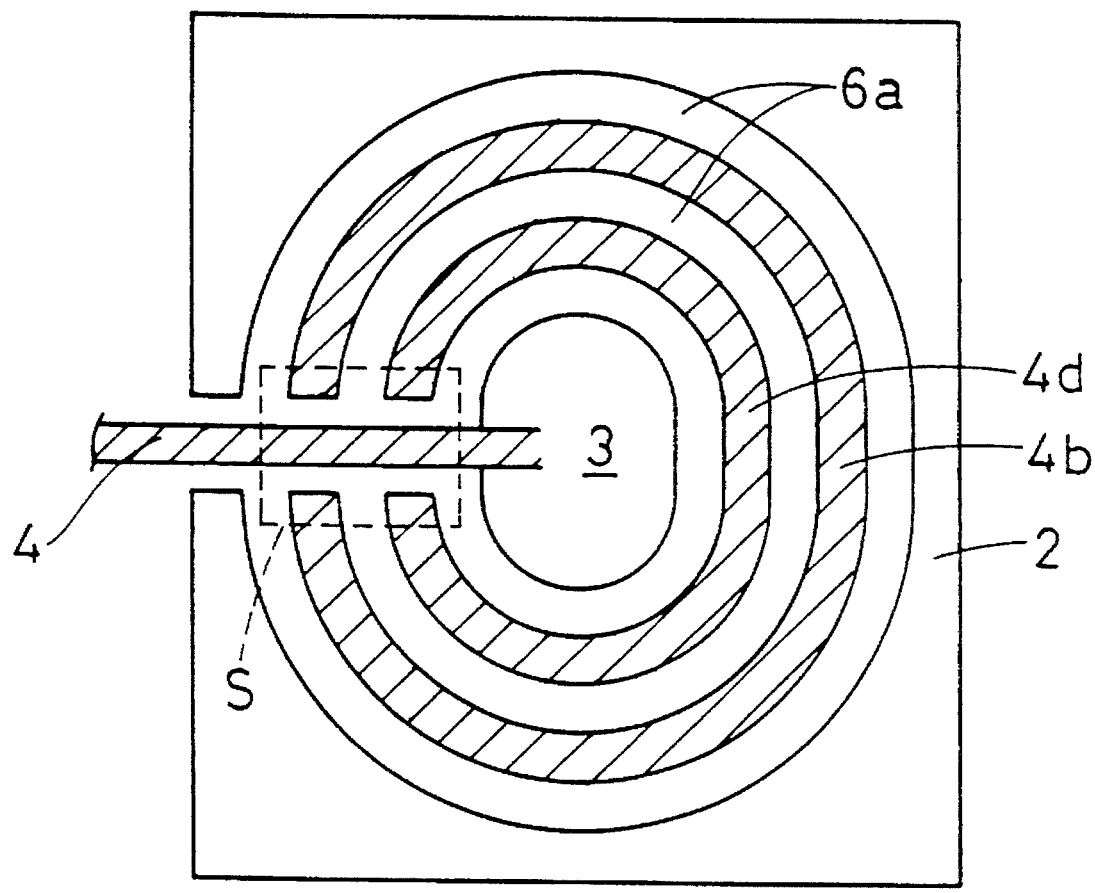
FIG. 6 is a plan view showing a second preferred embodiment of the present invention.
Figure 7:
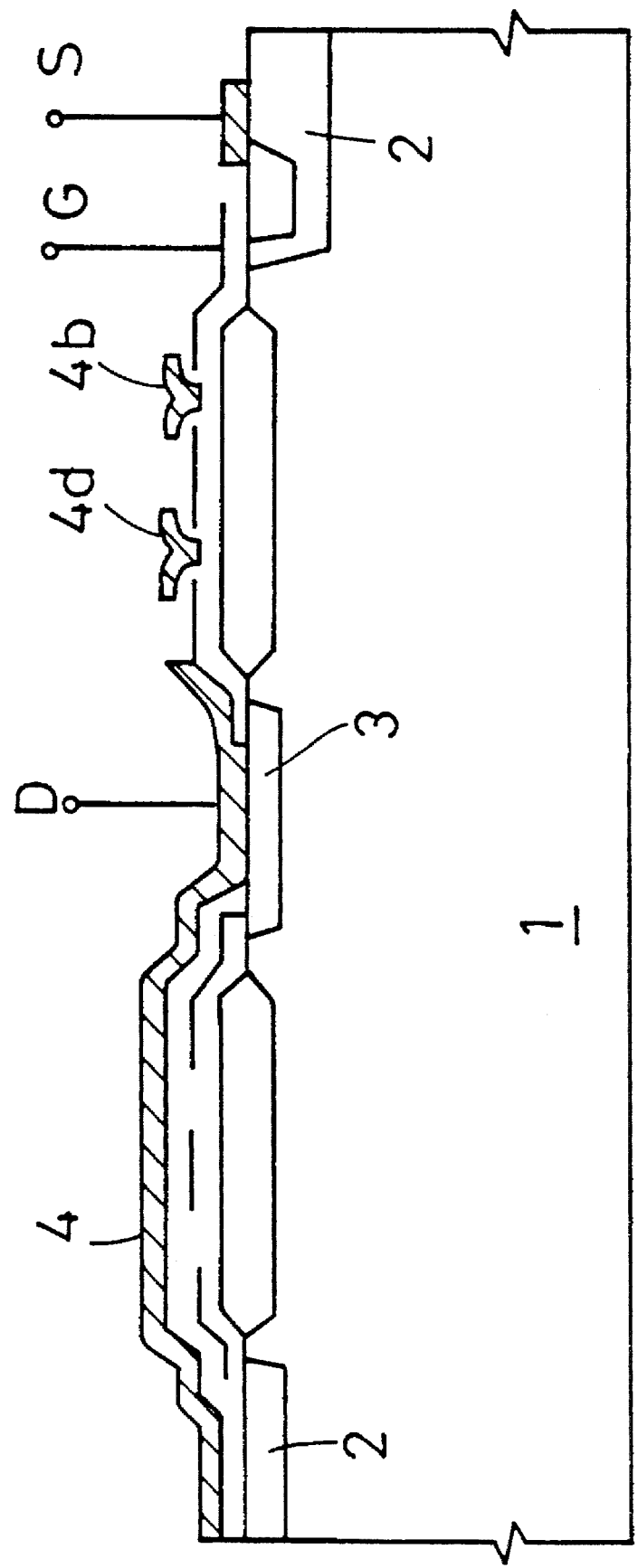
FIG. 7 is a cross sectional view showing an N-channel MOS structure.

Even with modification that the wiring conductive film 4 is connected with the diffusion region 3 different from the first preferred embodiment, the field concentration is also diminished. FIG. 6 is a plan view of such a semiconductor device according to a second preferred embodiment of the present invention. The diffusion region 3 intercepts a surface of the insulation layer 6a in the form of an island, and is connected with the wiring conductive film 4. The conductive films 4b and 4d are formed on the insulation layer 6a around the diffusion region 3 so that they do not cross the wiring conductive film 4. The p type diffusion region 2 also intercepts the surface of the insulation layer 6a around the conductive films 4b and 4d. The semiconductor device tailored as above is suitable to high-breakdown voltage application. An N-channel MOS device of FIG. 7 is one of such examples.

The second preferred embodiment is same as the first preferred embodiment with regard to the arrangement of the conductive films 5a, 5c, 5e, 4b and 4d in the region S of FIG. 3. Hence, similarly to the first preferred embodiment, the conductive films 5a, 5c and 5e have much larger capacitances with the conductive films 4b and 4d than with the conductive film 4.

Figure 8:
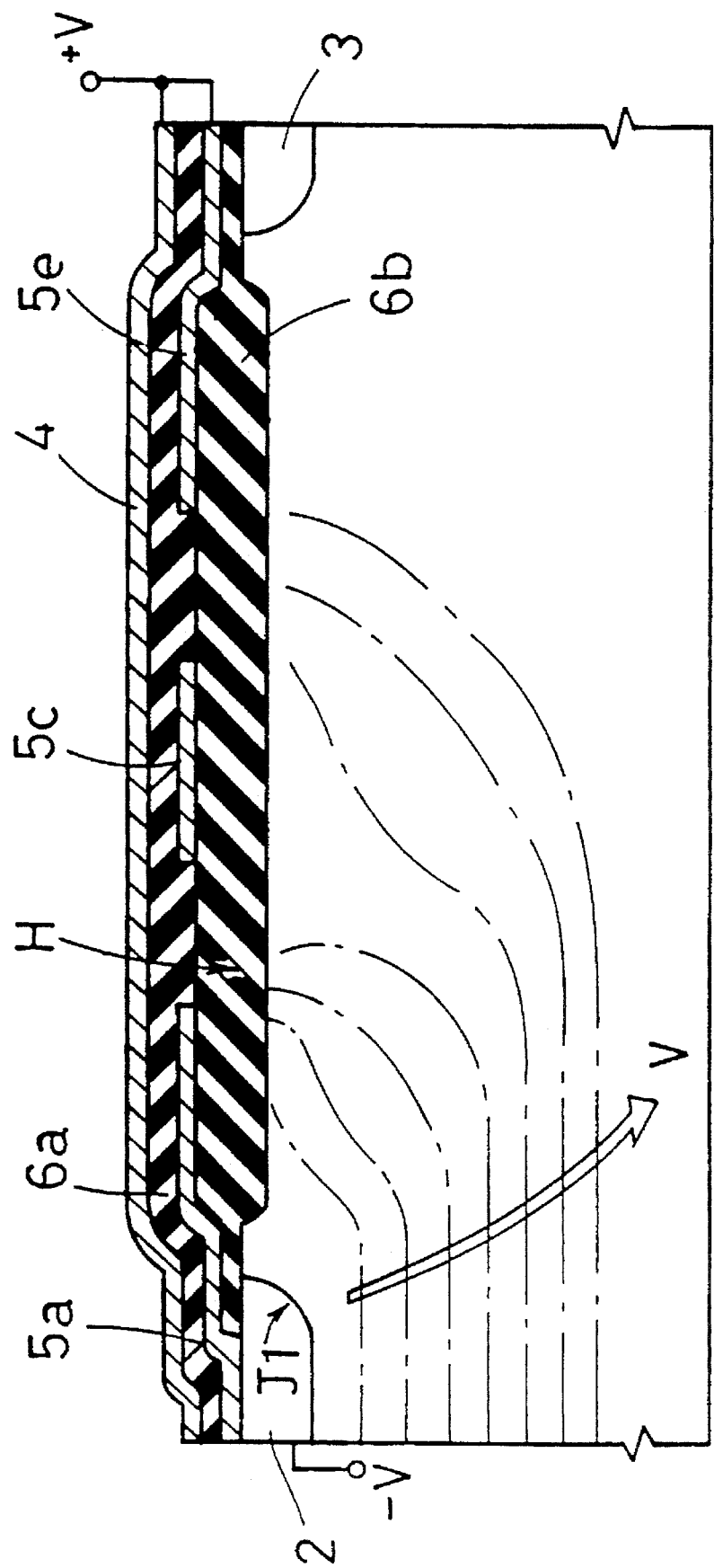
FIGS. 8 and 9 are cross sectional views for explaining device operation of the second preferred embodiment of the present invention.

Being at the same potential as the diffusion region 2, the conductive film 4 restrains the growth of a depletion layer. Hence, but for the conductive films 4b and 4d, the equipotential lines will extend as shown in FIG. 8 (dashed-and-dotted lines) immediately below the wiring conductive film 4, thereby electric field concentrations H being created the edge of the conductive film 5a.

Figure 9:
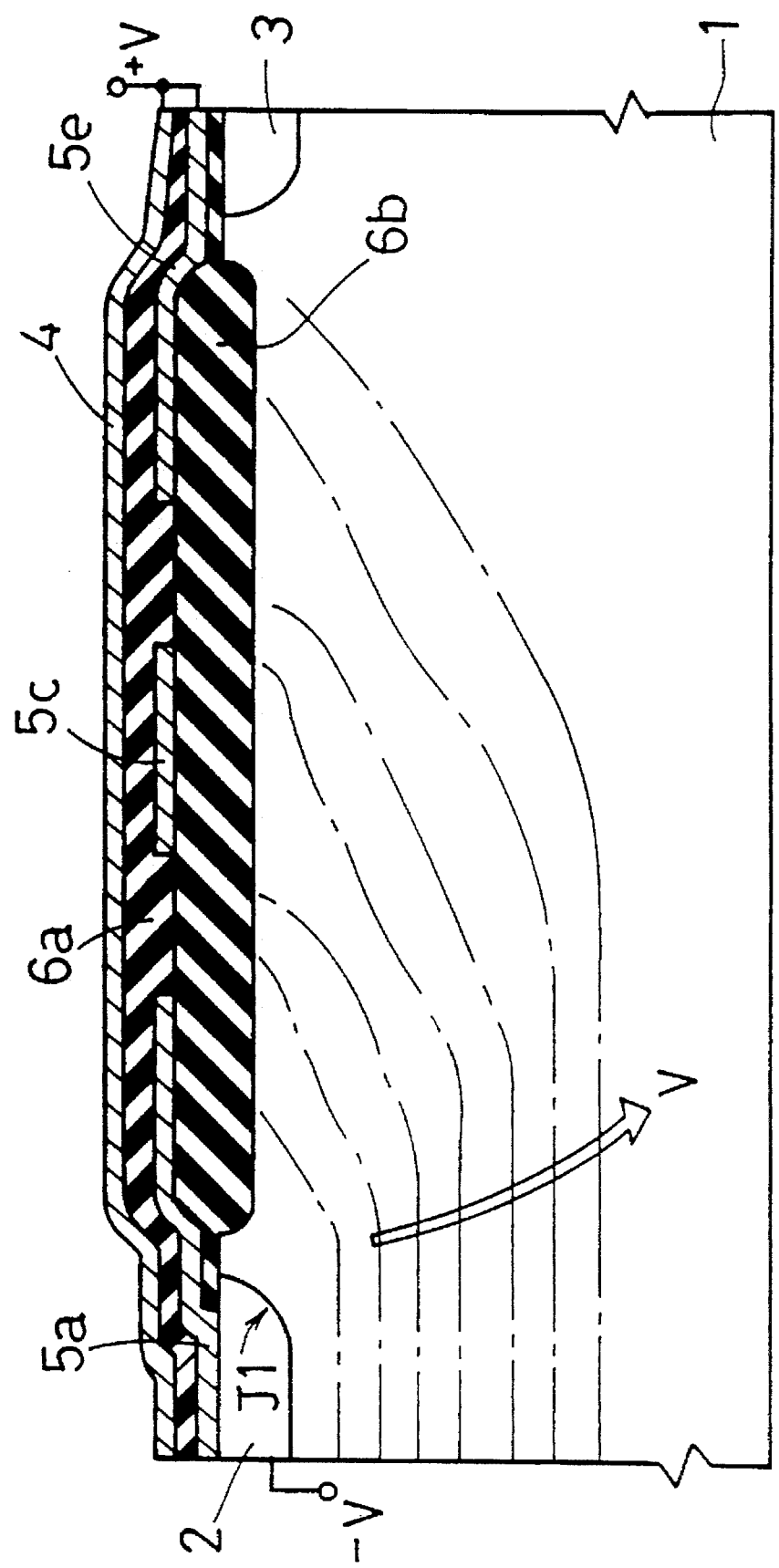

With the conductive films 4b and 4d provided, on the other hand, the conductive films 5a, 5c and 5e have greater capacitances with the conductive films 4b and 4d and than with the conductive film 4. This allows, immediately below the wiring conductive film 4, the equipotential lines to grow as shown in FIG. 9. Thus, in the absence of direct influence of the electric field developed from the wiring conductive film 4 over electric field developed within the n⁻ type layer 1, the electric field concentrations are moderated. As is shown in the first and the second preferred embodiments, the electric field concentrations are moderated when the potential of the conductive film 4 varies in a range from the low voltage (of the diffusion layer 2) to the high voltage (of the diffusion layer 3). Moreover, it is clear that the electric field concentrations are moderated even if the potential of the conductive film 4 varies in a wider range.

Unless the breakdown voltage is extremely deteriorated because of a voltage difference between the conductive films 5a and 5e or between the diffusion regions 2 and 3, the second preferred embodiment does not necessarily require the conductive films 5a and 5e to be connected with the diffusion regions 2 and 3, respectively.

Figure 10:
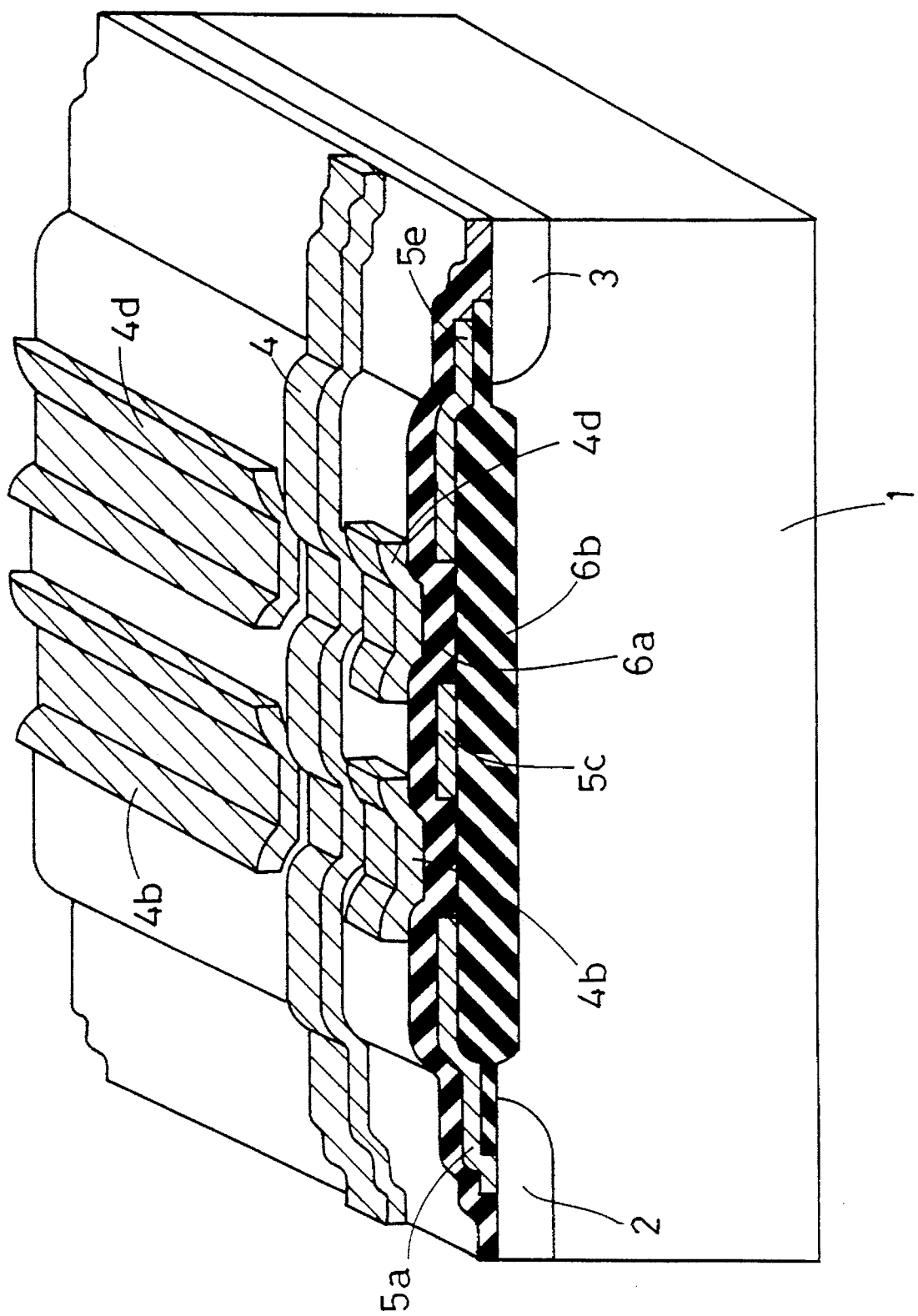
FIG. 10 is a cross sectional perspective view showing a third preferred embodiment of the present invention.

FIG. 10 is a perspective view of a semiconductor device according to a third preferred embodiment of the present invention in cross section. The structure shown in FIG. 10 differs from the structure of FIG. 3 only in that the conductive film 5e and the diffusion region 3 are not directly connected but coupled via the insulation layer 6b. Even with the structure modified as such, by providing an enough large capacitance between the conductive film 5e and the insulation layer 6b, the third preferred embodiment promises the effects obtainable in the first and the second preferred embodiments.

Figure 11:
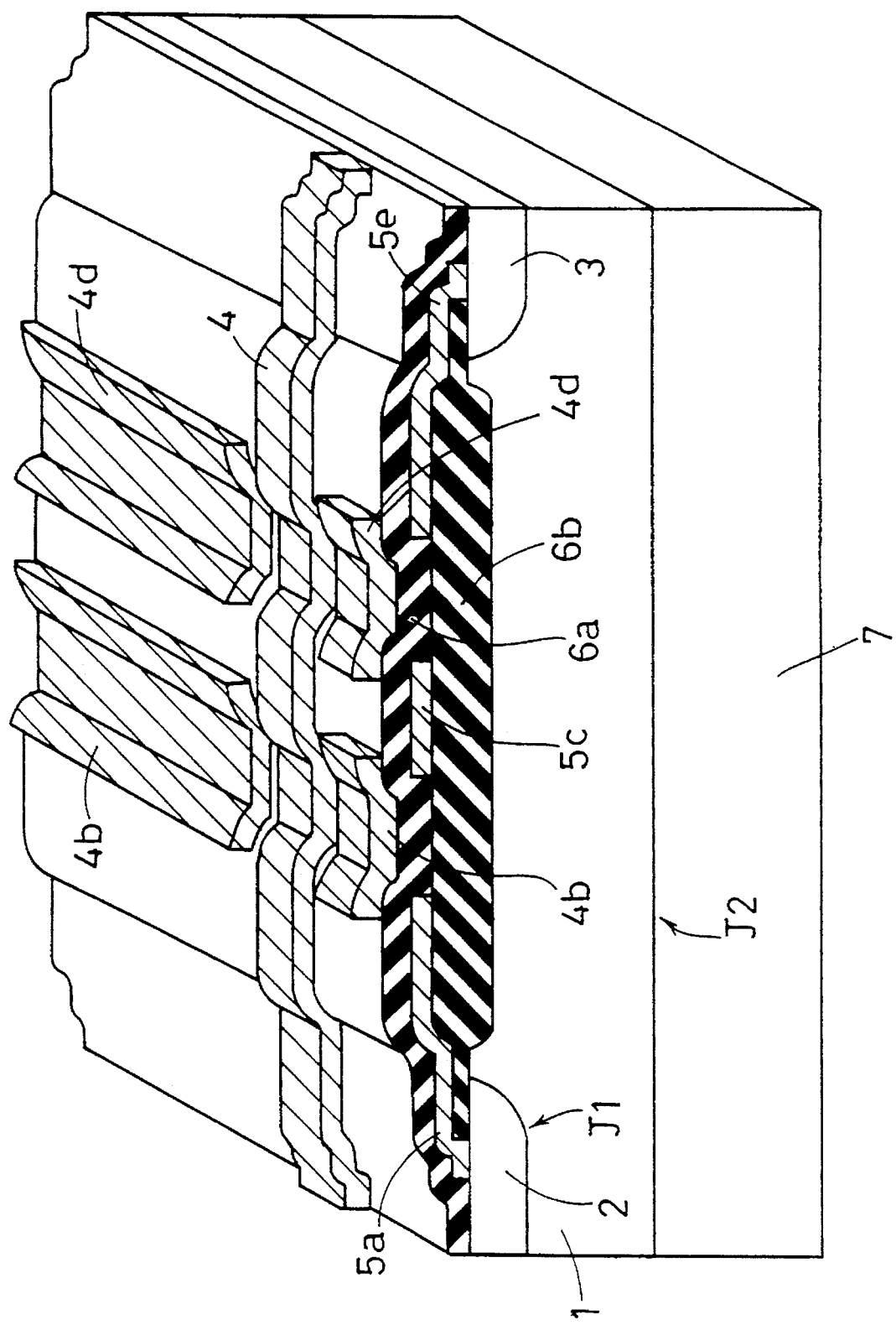
FIG. 11 is a cross sectional perspective view showing a fourth preferred embodiment of the present invention.

FIG. 11 is a perspective view of a semiconductor device according to a fourth preferred embodiment of the present invention in cross section. The semiconductor device of the fourth preferred embodiment includes the structure of FIG. 3 with a slight change that the n⁻ type layer 1 is formed on a substrate 7 but is otherwise the same as the devices of the preceding embodiments.

With the diffusion region 2 biased low and the diffusion region 3 biased high, a depletion layer extends from the junction J1 between the n⁻ type layer 1 and the diffusion region 2. In the surface of the n⁻ type region 1, or immediately below the insulation layer 6b, the depletion layer extends from the diffusion region 2 toward the diffusion region 3. With the p⁻ type substrate 7 also low, another depletion layer grows from a junction J2 between the n⁻ type layer 1 and the p⁻ type substrate 7. Due to the newly developed depletion layer, the concentration of an electric field near the diffusion region 2 is moderated. Hence, the semiconductor device has a high breakdown voltage.

The wiring conductive film 4 helps the depletion growth when staying at the same potential as the diffusion region 2 (FIG. 2), but restrains the depletion growth when staying at the same potential as the diffusion region 3 (FIG. 6).

The influence of the wiring conductive film 4, however, is eliminated in a similar manner to the first and second preferred embodiments. By establishing between the conductive films 5a, 5c and 5e and the conductive films 4b and 4d capacitances which are enough larger than a capacitance between the conductive film 5c and the conductive film 4, optimum potentials are available at the conductive films 5c, 4b and 4d under almost no influence of a potential at the conductive film 4. Thus, the effects obtainable in the first and second preferred embodiments are ensured in the fourth preferred embodiment.

Figure 12:
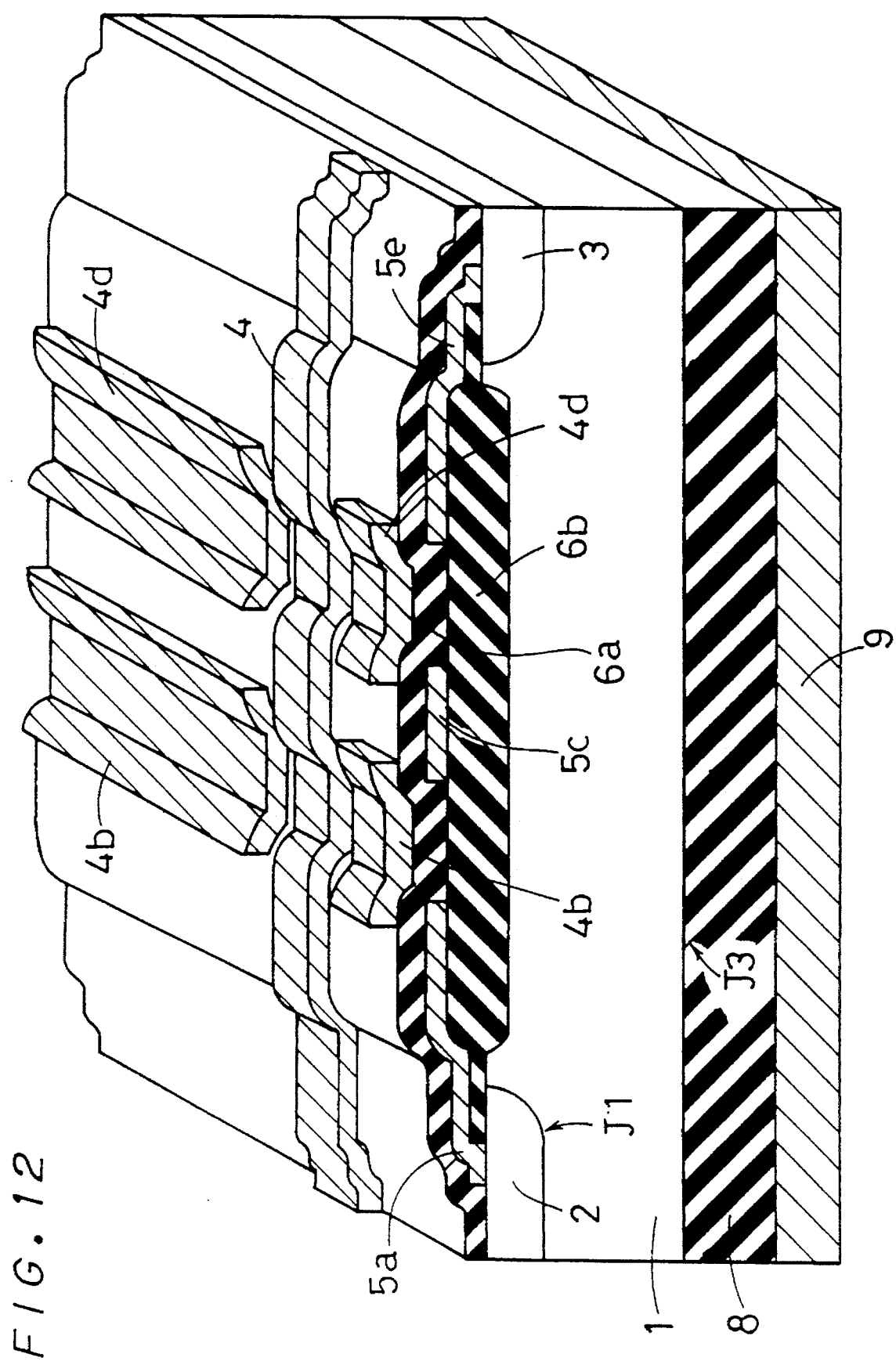
FIG. 12 is a cross sectional perspective view showing a fifth preferred embodiment of the present invention.

FIG. 12 is a perspective view of a semiconductor device according to a fifth preferred embodiment of the present invention in cross section. A difference from the device structure of FIG. 11 is only that the p⁻ type substrate 7 is replaced by a conductive film 9 disposed across the back surface of the n⁻ type layer 1 via an insulation layer 8.

When the diffusion region 2 and the conductive film 9 are low and the diffusion region 3 is high, a depletion layer extends from the junction J1 between the n⁻ type layer 1 and the diffusion region 2. Thus, the depletion layer as viewed at the surface of the n⁻ type layer 1 (i.e., immediately below the insulation layer 6b) extends from the diffusion region 2 toward the diffusion region 3. Since the applied field from the conductive film 9 permits another depletion layer to grow easily from a junction J3 between the n⁻ type layer 1 and the insulation layer 8, the field concentration near the diffusion region 2 is moderated, the breakdown voltage of the semiconductor device thereby being enhanced.

The semiconductor device having the cross sectional structure as above remains similar to the devices of the precedent embodiments in that the wiring conductive film 4 helps the depletion growth when having the same potential as the diffusion region 2 (FIG. 2), but suppresses the depletion growth when having the same potential as the diffusion region 3 (FIG. 6).

The influence of the wiring conductive film 4, however, is eliminated in a similar manner to the first and second preferred embodiments. By allowing that capacitances between the conductive films 5a, 5c and 5e and the conductive films 4b and 4d are enough larger than a capacitance between the conductive film 5c and the conductive film 4, optimum potentials are obtainable at the conductive film 5c and the conductive films 4b and 4d under almost no influence of a potential at the conductive film 4. Hence, the effects promised in the first and second preferred embodiments are also ensured in the fifth preferred embodiment.

While the invention has been shown and described in detail, the foregoing description is in all aspects illustrative and not restrictive. It is understood that numerous modifications and variations can be devised without departing from the scope of the invention.

We claim:

1. A semiconductor device, comprising:

a first semiconductor layer of a first conductivity type, said first semiconductor layer having a first major surface and a second major surface;

a second semiconductor layer of a second conductivity type selectively formed in said first major surface of said first semiconductor layer;

a third semiconductor layer of a first conductivity type selectively formed in said first major surface of said first semiconductor layer, said third semiconductor layer being spaced from said second semiconductor layer;

a first insulating layer disposed between said second and said third semiconductor layers on said first major surface of said first semiconductor layer, said first insulating layer overlying a portion of at least one of said second semiconductor layer and said third semiconductor layer;

at least one first conductive film formed on said first insulating layer;

a second conductive film formed at least on said first insulating layer, said second conductive film being electrically coupled to said second semiconductor layer;

a third conductive film formed at least on said first insulating layer, said third conductive film being electrically coupled to said third semiconductor layer;

a second insulating layer covering said first, said second and said third conductive film, said first insulating layer, and said second and said third semiconductor layer;

at least two fourth conductive films formed on said second insulating layer, said fourth conductive films each being electrically coupled to two of said first, second and said third conductive films neighboring thereunder; and a wiring conductive film formed on said second insulation film, said wiring conductive film extending from said second semiconductor layer to said third semiconductor layer, said wiring conductive film and said at least two fourth conductive films being provided in a non-overlapping manner in a direction of the thickness of said first semiconductor layer;

wherein said at least one first conductive film and said second and said third conductive films each have a larger capacitance with said fourth conductive films than with said wiring conductive film.

2. The semiconductor device of claim 1, wherein said second conductive film is formed also on said second semiconductor layer and connected with said second semiconductor layer.

3. The semiconductor device of claim 1, wherein said third conductive film is formed also on said third semiconductor layer and connected with said third semiconductor layer.

4. The semiconductor device of claim 2, wherein said third conductive film is coupled to said third semiconductor layer via said first insulation layer.

5. The semiconductor device of claim 1, wherein said first and said second conductivity types are an n type and a p type, respectively.

6. The semiconductor device of claim 5, further comprising means for biasing said third semiconductor layer at a potential higher than said second semiconductor layer.

7. The semiconductor device of claim 1, wherein said fourth conductive films face said at least one first, said second and said third conductive films in larger areas than said wiring conductive film faces said at least one first, said second and said third conductive films.

8. The semiconductor device of claim 1, wherein said fourth conductive films are disposed around said second semiconductor layer except at a predetermined region;

said third semiconductor layer is disposed around said fourth conductive films; and said wiring conductive film is formed in said predetermined region.

9. The semiconductor device of claim 8, further comprising means for biasing said wiring conductive film at a same potential as said second semiconductor layer.

10. The semiconductor device of claim 8, further comprising means for biasing said wiring conductive film at a same potential as said third semiconductor layer.

11. The semiconductor device of claim 10, wherein said third semiconductor layer forms a drain of a MOS transistor structure.

12. The semiconductor device of claim 1, further comprising a fourth semiconductor layer formed on said second major surface of said first semiconductor layer.

13. The semiconductor device of claim 1, further comprising:

a third insulation layer formed on said second major surface of said first semiconductor layer; and a fifth conductive film formed on said third insulation layer.

14. The semiconductor device of claim 12, further comprising means for biasing said fourth semiconductor layer at a same potential as said second semiconductor layer.

* * * * *